United States Patent
Krassnitzer

(10) Patent No.: US 11,060,181 B2
(45) Date of Patent: Jul. 13, 2021

(54) DECORATIVE HIPIMS HARD MATERIAL LAYERS

(71) Applicant: Oerlikon Surface Solutions AG, Trubbach, Trubbach (CH)

(72) Inventor: Siegfried Krassnitzer, Feldkirch (AT)

(73) Assignee: OERLIKON SURFACE SOLUTIONS AG, PFAFFIKON, Pfaffikon Sz (CH)

( * ) Notice: Subject to any disclaimer, the term of this patent is extended or adjusted under 35 U.S.C. 154(b) by 96 days.

(21) Appl. No.: 14/901,313

(22) PCT Filed: Jun. 26, 2014

(86) PCT No.: PCT/EP2014/063611
§ 371 (c)(1),
(2) Date: Dec. 28, 2015

(87) PCT Pub. No.: WO2014/207154
PCT Pub. Date: Dec. 31, 2014

(65) Prior Publication Data
US 2016/0369386 A1  Dec. 22, 2016

Related U.S. Application Data

(60) Provisional application No. 61/839,454, filed on Jun. 26, 2013.

(51) Int. Cl.
*H01J 37/34* (2006.01)
*C23C 14/00* (2006.01)
(Continued)

(52) U.S. Cl.
CPC ...... *C23C 14/3485* (2013.01); *C23C 14/0015* (2013.01); *C23C 14/0036* (2013.01);
(Continued)

(58) Field of Classification Search
CPC ..... C23C 14/0036; C23C 14/06; C23C 14/22; C23C 14/3485; C23C 14/0688;
(Continued)

(56) References Cited

U.S. PATENT DOCUMENTS 4,415,421 A    11/1983  Sasanuma
6,735,099 B2 *  5/2004  Mark ................. H02M 7/5387
                                           307/29
(Continued)

FOREIGN PATENT DOCUMENTS

DE    3134587 A1    5/1982
DE    3150039 A1    6/1983
(Continued)

OTHER PUBLICATIONS

Machine Translation EP 1614764 (Year: 2006).*
(Continued)

*Primary Examiner* — Michael A Band
(74) *Attorney, Agent, or Firm* — Pearne & Gordon LLP

(57) ABSTRACT

A method for coating substrates with a decorative layer of hard material which is guided into a vacuum coating chamber. The decorative layer of hard material is deposited by a reactive HIPIMS-process, and the energy content in the power pulses is controlled in such a manner that the deposited layer of hard material has a homogeneous colour, a high degree of smoothness and a high strength.

22 Claims, 4 Drawing Sheets

(51) Int. Cl.
C23C 14/06 (2006.01)
C23C 14/34 (2006.01)
C23C 14/35 (2006.01)
C23C 14/54 (2006.01)

(52) U.S. Cl.
CPC ...... *C23C 14/0042* (2013.01); *C23C 14/0057* (2013.01); *C23C 14/0664* (2013.01); *C23C 14/3492* (2013.01); *C23C 14/35* (2013.01); *C23C 14/541* (2013.01); *H01J 37/3426* (2013.01); *H01J 37/3467* (2013.01); *C23C 14/0641* (2013.01)

(58) Field of Classification Search
CPC ............ C23C 14/3492; C23C 14/0015; C23C 14/0057; C23C 14/541; C23C 14/0664; C23C 14/0641; C23C 14/35; H01J 37/3467; H01J 37/3426; H01J 37/3429
USPC ...................... 359/586; 204/192.13; 423/325
See application file for complete search history.

(56) References Cited

U.S. PATENT DOCUMENTS

| | | | | |
|---|---|---|---|---|
| 7,147,759 | B2* | 12/2006 | Chistyakov | C23C 14/35 204/192.12 |
| 2005/0103620 | A1* | 5/2005 | Chistyakov | H01J 37/3405 204/192.12 |
| 2006/0066248 | A1* | 3/2006 | Chistyakov | H01J 37/32082 315/111.21 |
| 2010/0282598 | A1* | 11/2010 | Ruske | C23C 14/0036 204/192.13 |
| 2012/0164051 | A1* | 6/2012 | Bruns | C23C 14/0078 423/325 |
| 2012/0212826 | A1* | 8/2012 | Henn | C03C 17/3435 359/586 |

FOREIGN PATENT DOCUMENTS

| | | | |
|---|---|---|---|
| DE | 3731127 | C2 | 11/1990 |
| EP | 0 201 508 | B1 | 11/1986 |
| EP | 1 614 764 | B1 | 4/2009 |
| EP | 2157205 | A1 | 2/2010 |
| EP | 2 492 251 | A1 | 8/2012 |
| JP | 60089565 | A * | 5/1985 ......... C23C 14/0664 |
| JP | 09025562 | A * | 1/1997 |
| JP | 2010031359 | A | 2/2010 |
| JP | 2012171866 | A | 9/2012 |
| JP | 2016522517 | A | 7/2016 |
| WO | 86/00650 | A1 | 1/1986 |
| WO | 2006044001 | A1 | 4/2006 |
| WO | 2014203088 | A1 | 12/2014 |

OTHER PUBLICATIONS

Ehiasarian, et al., "High Power Pulsed Magnetron Sputtered CrNx Films", Surface and Coatings Technology, Elsevier, Amsterdam, NL, Bd. 163-164, Jan. 1, 2003.

Alami, et al., "On the Relationship Between the Peak Target Current and the Morphology of Chromium Nitride Thin Films Deposited by Reactive High Power Pulsed Magnetron Sputtering", Journal of Physics D: Applied Physics, Institute of Physics Publishing Ltd., GB, Bd. 42, Nr. Jan. 7, 2009.

Ehiasarian, et al., "Influence of High Power Impulse Magnetron Sputtering Plasma Ionization on the Microstructure of TiN Thin Films", Journal of Applied Physics, American Institute of Physics, US, Bd. 109, Nr. 10, May 23, 2011.

Magnus, et al., "Comparison of TiN Thin Films Grown on SiO2 by Reactive dc Magnetron Sputtering and High Power Impulse Magnetron Sputtering", Materials Research Society Symposium Proceedings—Materials, Processes, and Reliability for Advanced Interconnects for Micro- and Nanoelectronics, Bd. 1335, Apr. 25, 2011.

Machunze, et al., "Stress and Texture in HIPIMS TiN Thin Films", Bd. 518, Nr. 5, Dec. 31, 2009.

Hallman, "Master's Thesis: A Study of TiN Coatings on Medical Implants Deposited by HIPIMS", retrieved from Internet: URL:https://pure.ltu.se/portal/files/32579478/LTU-EX-2011-32548427.pdf, Feb. 21, 2011.

Roquiny, et al., "Colour Control of Titanium Nitride Coatings Produced by Reactive Magnetron Sputtering at Temperature Less Than 100<o>C", Surface and Coatings Technology, Bd. 116-119, Sep. 1, 1999.

International Search Report for PCT/EP2014/063611 dated Sep. 9, 2014.

Written Opinion for PCT/EP2014/063611 dated Sep. 9, 2014.

* cited by examiner

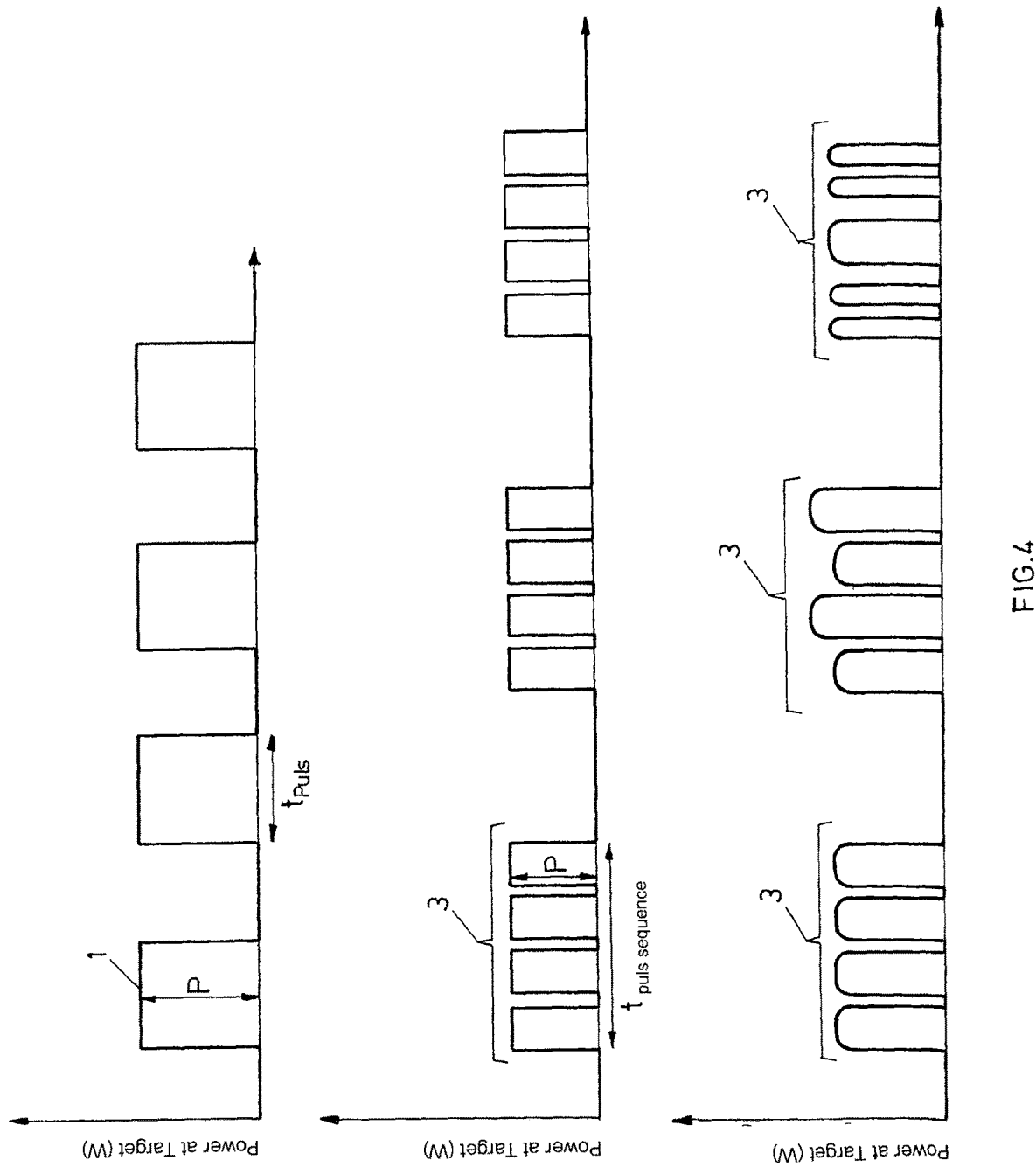

DECORATIVE HIPIMS HARD MATERIAL LAYERS

The invention is directed to a method for coating substrates with a decorative hard-material layer which is performed in a vacuum coating chamber, whereby the decorative hard-material layer is deposited by means of a reactive HIPIMS-process (High Power Pulse Magnetron Sputtering), and the energy content in power pulses is regulated so that the deposited hard-material layer has a homogeneous color, a high smoothness and a high hardness.

PRIOR ART

The U.S. Pat. No. 4,415,421A describes a method for manufacturing decorative, gold-colored layers which comprise deposition of a stainable protective layer of TiN by means of electron beam evaporation and deposition of a gold layer on the surface of the TiN-layer by means evaporation of gold.

The patent EP0201508B1 describes gold-colored TiN-layers doped with gold and the manufacturing methods thereof.

In the Patent DE3134587C2 there is nevertheless addressed that for the practical appliance, gold is not well suited as a material for manufacturing gold-colored films because it is, on one hand, very expensive and it provides on the other hand, no good abrasion resistance and is consequently easily deteriorated. Therefore, one proposes in the DE3134587C2 to make use of a coating, which comprises instead of a gold-colored layer of gold, a gold-colored layer of a Cu—Sn—Al-alloy. The gold-colored Cr—Sn—Al-layer shall be applied between a primary coating and a final coating. The primary and the final coatings may be realized according to the DE3134587C2 in that a paint color of a material as of Polyester, Acrylic resin or Polyurethane is applied by means of spraying or brushing and is thereafter heated and then dried thereby realizing a predetermined thickness. For the final coating a transparent paint color shall be used.

A further possibility to manufacture a gold-colored coating without having to use gold as coating material is described in the German Laid Open DE3150039A1. According to the DE3150039A1 a gold-colored layer, free of gold, is manufactured from TiN and ZrN which exhibits a good abrasion resistance.

Similarly the DE3731127C2 proposes a method for decorative coating of substrates by which a gold-colored layer is deposited by means of cathodic arc evaporation from a target of a Ti, Zr or TiZr-alloy, whereby the coating is performed in a reactive atmosphere containing nitrogen and whereby the target has a negative polarity with respect to the anode. The DE3731127C2 teaches that by making use of a target of TiZr-alloy and of nitrogen gas, gold-colored layers may be manufactured which have a composition $Ti_xZr_{1-x}N$ with $0<x<1$ the color appearance thereof varying with x. Further, the DE3731127C2 teaches that by a use of a Ti-target and of nitrogen as reactive gas and additionally of $O_2$- and/or of C-containing gas as a doping gas, gold-colored TiN-layers may be manufactured which are doped with $O_2$ and/or C, the color-appearance thereof varying as a function of the relative doping content.

Additionally, the DE3731127C2 teaches that by the use of a Zr-target and of nitrogen as reactive gas and additionally also of $O_2$- and/or C-containing gas as a doping gas, white gold-colored TiN-layers may be manufactured which are doped with $O_2$ and/or C, the color appearance of which varying as a function of the relative doping content The patent EP1614764B1 describes a decorative object with a cold colored coating the color thereof being realized by depositing a multitude of superimposed pairs of alternate TiN- and ZrN-layers whereby the ratio of the weight of Zr and of the sum of the weights of Zr and Ti within the coating is between 50% and 80%. On one hand this multilayer structure results in a color according of gold 2N18 or 1N14 or 3N18 and on the other hand the multilayer structure allows that, whenever the outermost layers are worn, the color appearance is still maintained. In the EP1614764B1 it is also mentioned that the method for depositing the decorative layer on an object should be preferably a sputtering method in which Ti- and Zr-containing sputtering sources are used.

R. Hallmann reports in his master theses "A Study of TiN Coatings on Medical Implants Deposited by HiPIMS", which was made at the Technical University of Luleain in Sweden that he succeeded to manufacture TiN-layers with different color appearances from golden-yellow up to brownish by means of HIPIMS. Hallmann mentions that a significant influence of some coating characteristics as e.g. of porosity and density upon the color appearance could be ascertained and also a slight correlation was found between color appearance and oxygen content.

In the journal Surface and Coatings Technology 116-119 (1999) 278-283 Roquiny reports about the influence of nitrogen flow on the color of TiN-layers which were deposited using reactive sputtering processes. The color of the deposited TiN-layers varied according to Roquiny from metallic grey via gold up to brownish red as the nitrogen flow was increased.

Nevertheless, manufacturing of homogeneous layer colors when coating by means of a reactive sputter- or HIPIMS-processes is still a big challenge.

When coating by means of reactive sputter- or HIPIMS-processes often a metallic target is used as a sputtering material source whereby at least one reactive gas is used which reacts at least partially with material from the target surface in such a manner that areas of the target surface become covered by the material, which results from the reaction and which is commonly a ceramic material. The degree of covering depends from the process parameters e.g. significantly from the reactive gas flow. This phenomenon is normally called target poisoning. One says, that the target is completely poisoned when the target surface is completely covered.

Principally target poisoning is a severe problem when manufacturing decorative layers by means of reactive sputter- or HIPIMS-processes because at such processes target poisoning normally leads to the appearance of hysteresis behavior with respect to the process parameters and leads generically to process instability.

Consequently, the industrial manufacturing of decorative layers exhibiting a homogeneous layer color by means of reactive sputter- or HIPIMS-processes is not economical, especially not, if a coating chamber having of large dimensions is used, because in this case the inhomogeneity of the resulting coating color at the coated substrates, which are distributed along the coating chamber, is even larger.

Beside of this, there exists a further problem, when using HIPIMS-processes, namely that, due to the pulsating variation of the sputter power as used, there occur variations of partial pressure of the reactive gas in the coating chamber during the coating process, which as well lead to inhomogeneity of the resulting layer color.

OBJECT OF THE PRESENT INVENTION

It is the object of the present invention to provide a method for coating surfaces of substrates with decorative hard-material layers which, on one hand imparts to the coated surface, a durable colored appearance and, on the other hand, allows an easy realization of a homogeneous color appearance.

SUMMARY OF THE INVENTION

The object of the present invention is resolved by providing a method according to claim 1.

The inventor has found that it is surprisingly possible to produce hard-material layers with a highly homogeneous color appearance, with a very high hardness and with a very smooth layer surface by means of reactive HIPIMS-processes, which layers, due to these layer characteristics are especially highly suited for decorative applications, if at the HIPIMS-process, power pulses and/or power pulse-sequences are applied with an energy content, with respect to the target surface, of at least, preferably larger than 0.2 Joule/cm$^2$ per power pulse or respectively per power pulse-sequence. We understand by the term "power pulse-sequence" a burst of multiple power pulses.

The FIG. 4 shows exemplary representations of possible power courses at the target for a better understanding of the terms which are used in the frame of the present invention.

Under the term "power pulse or power pulse-sequence with an energy content with respect to the target surface" one understands within the frame of the present invention the complete energy content which is input to the target surface during the pulse duration, $t_{Puls}$, of a power pulse 1 or during the sequence duration, $t_{Pulssequenz}$, of a power pulse-sequence 3, whereby, as surface of the target, that target surface is considered upon which the plasma is effectively projected during the pulse duration, $t_{Puls}$, of the power pulse 1 or, respectively, during the sequence duration (pulse burst duration), $t_{Pulssequenz}$, of the power pulse-sequence 3. This target surface is often named "Racetrack" and may be recognized at the target as area of target material consumption.

The energy content to be applied according to the invention to a power pulse 1 at the HIPIMS-process may, as an example, be realized by setting a respectively very high pulse power, P, and/or setting of a respectively very extended pulse length or pulse duration, $t_{Plus}$. The respective pulse power, P, and pulse duration, $t_{Puls}$, may obviously be set only so large, that the target material in the respective coating chamber arrangement does become thermally overloaded. In a similar manner the entire energy content, according to the invention may be realized in a power pulse-sequence 3 at the HIPIMS-process by setting the pulse powers, P, of the pulses which make up the sequence or the burst of pulses within a power pulse-sequence 3 and/or by setting the sequence duration, $t_{Pulssequenz}$, of the power pulse-sequence 3.

The HIPIMS-processes which are operated according to the invention are highly stable and astonishingly neither the process stability nor the homogeneity of the layer characteristics, which are important for decorative applications, or the hard-material layers, which are manufactured in this manner, are impaired by possible target poisoning appearances and/or reactive partial pressure variations.

More concretely, the present invention is directed to a method for coating of at least partial areas of the surface of a substrate or, respectively, to a method for manufacturing of substrates with a surface area having a decorative hard-material layer in a coating chamber, whereby for manufacturing the hard-material layer, a reactive HIPIMS-process is used at which at least one reactive gas is used and at least one target of a material which may react during operation of the HIPIMS-process with the reactive gas in such a manner, that thereby a predetermined layer color is produced and whereby the HIPIMS-process is operated making use of power pulses and/or power pulse-sequences with an energy content, with respect to the target surface, of at least, preferably of more than 0.2 Joule/cm$^2$ per power pulse or respectively per power pulse-sequence and thereby a homogeneous color appearance of the hard-material layer is realized.

It may not be excluded that beside of power pulses and/or power pulse-sequences (power pulse bursts), which fulfils these requirements also power pulses and/or power pulse-sequences (power pulse bursts) may be used which do not fulfil the addressed requirement namely with respect to energy content. Thereby, one can assume that at least 50% of the power pulses and/or power pulse-sequences which are applied, should fulfil the addressed requirement. As practiced today, practically all power pulses and respectively power pulse-sequences fulfil the addressed requirement or, respectively, the even sharper requirements still to be addressed.

Further, mixed operation may be applied with power pulses and with power pulse-sequences.

Further, it may be pointed out that the thermal loading of the target is also governed by the selected Duty-Cycle beside of by the pulse power and the pulse duration or respectively by single pulse powers and sequence duration (pulse burst duration), i.e. by:

the ratio of pulse duration (ON-time) to pulse period (ON-time+OFF-time) for power pulses or respectively
the ratio of pulse burst-(sequence)duration to pulse burst period (pulse burst ON-time+pulse burst OFF-time).

Preferably the energy content of at least, preferably of more than 0.2 Joule/cm$^2$ per power pulse or respectively per power pulse-sequence is set including setting of a power density of at least, preferably of more than 100 W/cm$^2$, preferably with a current density of at least, preferably of more than 0.2 A/cm$^2$.

According to a preferred form of realization of the present invention the HIPIMS-process is operated by making use of power pulses and/or power pulse-sequences with an energy content, with respect to the target surface, of at least, preferably of more than one 1 Joule/cm$^2$ per power pulse or respectively per power pulse-sequence.

This energy content per power pulse or respectively per power pulse-sequence is preferably input under setting of a power density of at least, preferably of more than 500 W/cm$^2$, preferably with a current density of at least, preferably of more than 1 A/cm$^2$.

According to an especially preferred realization form of the present invention, the HIPIMS-process is operated making use of power pulses and/or power pulse-sequences with an energy content, with respect to the target surface, of at least, preferably of more than 10 joules/cm$^2$ per power pulse or respectively per power pulse-sequence.

This energy content is preferably input under setting of a power density of at least, preferably of more than 1000 W/cm$^2$, preferably at a current density of at least, preferably of more than 2 A/cm$^2$.

Preferably, the concentration of the reactive gas within the coating chamber is controlled by a regulating—open-loop control or negative feedback control—of a reactive gas flow.

BRIEF DESCRIPTION OF THE DRAWINGS

In the following the present invention is further described by means of some examples and with the help of the FIGS. 1 to 4.

FIG. 4 shows exemplary representations of possible power courses at a target.

DESCRIPTION

Figure 1:
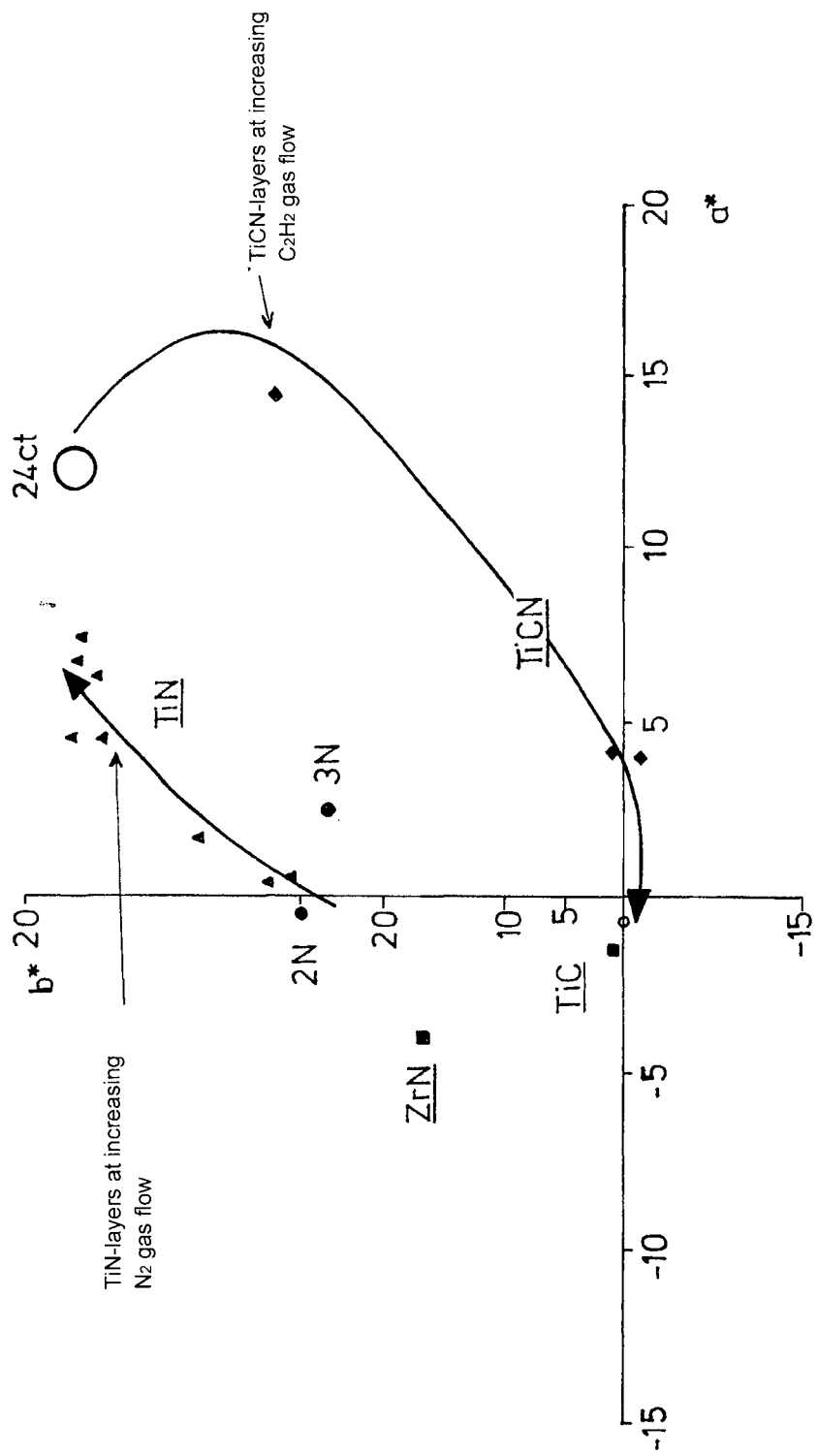
FIG. 1 shows CIELab color coordinates for TiN- and TiCN layers manufactured according to one aspect of the invention.

FIG. 1 shows the CIELab color coordinates a* and b*, which were measured at TiN- and TiCN-layers manufactured according to the invention and which were deposited at an increasing nitrogen gas flow or respectively at an increasing acetylene gas flow by means of the setting different nitrogen gas flows, TiN-layers with different gold standards could be manufactured. In a similar manner TiCN-layers with different colors could be manufactured by setting different acetylene gas flows.

Figure 2:
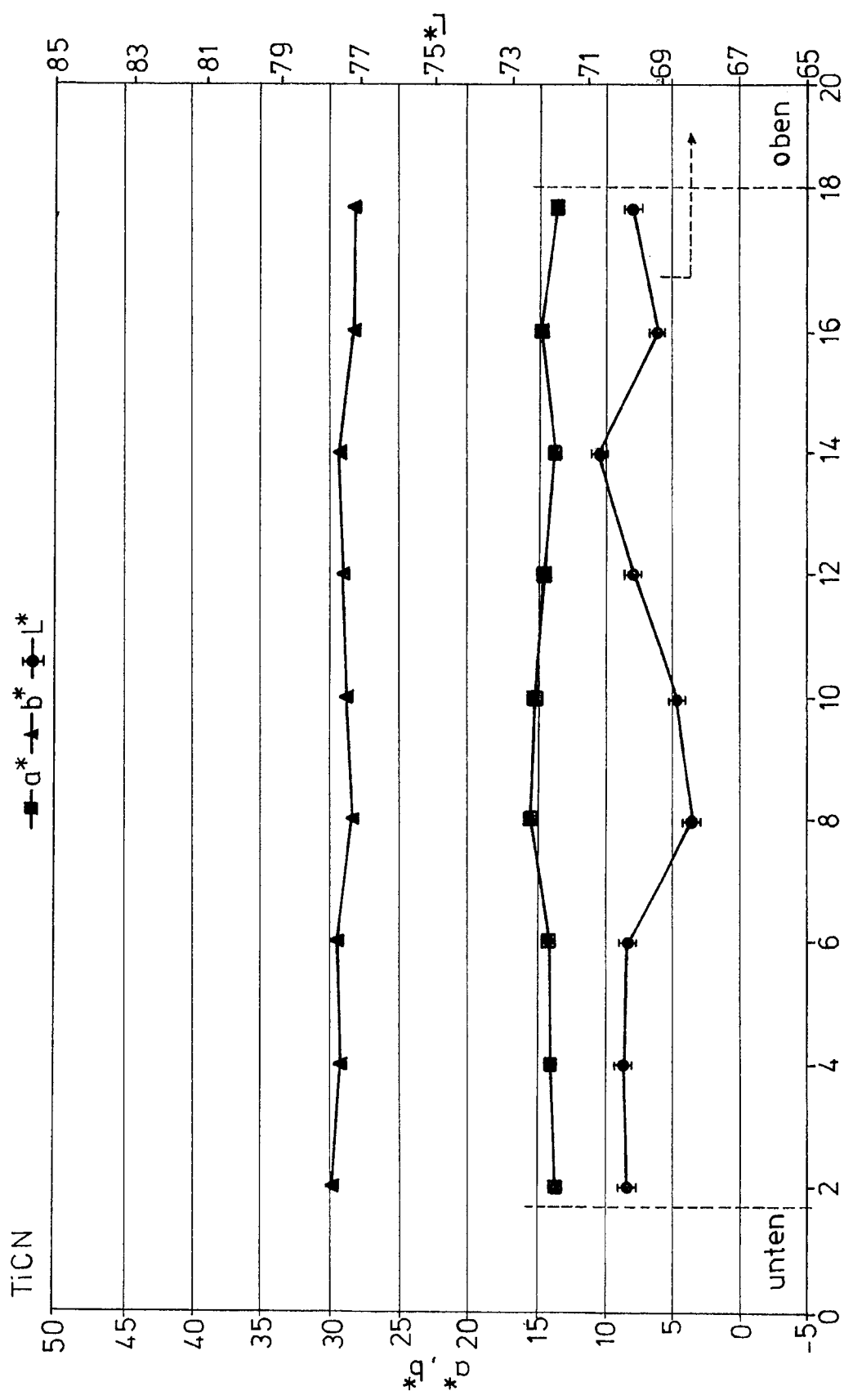
FIG. 2 shows CIELab color coordinates and brightness factor measured for TiCN-layers according to another aspect of the invention.

FIG. 2 shows the CIELab color coordinates a* and b* and the brightness factors L* which were measured at TiCN-layers manufactured according to the invention and which layers were applied in the same coating batch from Ti-Targets and under the use of a $N_2$- and $C_2H_2$-containing reactive gas flow on different substrates. The substrates were distributed before initiation of the coating method according to the invention along the height of the coating chamber so as to check upon homogeneity of the color appearance along the height extent of the coating chamber. A very good homogeneity of the layer color within the coating chamber could be confirmed. The coating height, that is the height of the coating chamber exploited for the coating of the substrates was, in this example, 400 mm whereby, for operating a method according to the present invention, the coating height is not limited on this height, the coating height may be smaller or larger.

Figure 3:
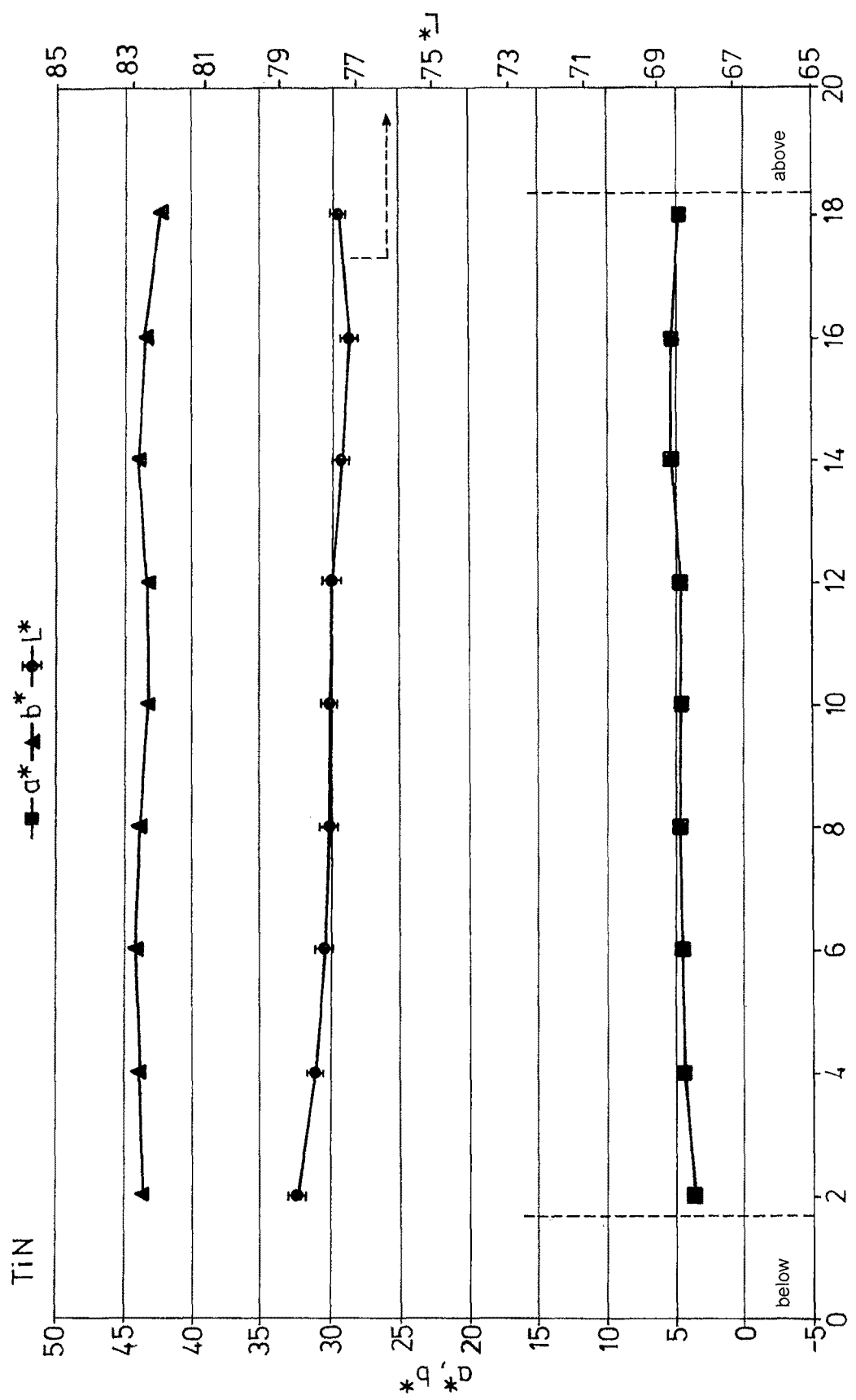
FIG. 3 shows CIELab color coordinates and brightness factor for gold colored TiN-layers according to another aspect of the invention.

FIG. 3 shows the CIELab color coordinates a* and b* and the brightness factor L* which were measured from gold colored TiN-layers deposited according to the invention and which were applied in the same coating batch and from TiN-targets and by using a $N_2$-containing reactive gas flow upon different substrates. The substrates were distributed before initiating the coating method according to the invention along the height of the coating chamber so as to check upon homogeneity of the golden color appearance along the height of the coating chamber. A very good homogeneity of the layer color within the coating chamber could be confirmed. The coating height i.e. the height within the coating chamber defined for coating substrates was in this example again 400 mm. Nevertheless, for operating of a method according to the invention, the coating height is not limited to this height, which means, the coating height may be smaller or larger.

An outstanding homogeneity of the color appearance along the entire coating height could be confirmed for the TiCN- and TiN-layers deposited according to the invention, as may be seen in the FIGS. 2 and 3.

Gold-colored layers with a multilayer layer-structure of a multitude of alternatingly deposited thin TiN- and ZrN-layers may also be perfectly manufactured by making use of a method according to the present invention. This, as an example in that one, using at the same HIPIMS-coating process uses, nitrogen as reactive gas and at least one HIPIMS-target of Ti as well as a HIPIMS-target of Zr positioned in the coating chamber so and operated so that TiN- and ZrN-layers are alternatingly deposited on the substrates to be coated.

According to the present invention different colors of the gold standard may be easily produced at hard-material layers deposited according to the present invention by setting different nitrogen flows, this especially when using Ti-containing targets or preferably targets which consist of titanium.

According to the invention the nitrogen flow may be exactly regulated so that the color appearance accords preferably a color according to that of gold 2N18 or 1N14 or 3N18.

The inventor has recognized that especially hard-material layers with nice colors for decorative applications may be manufactured by using targets which comprise titanium or titanium and aluminum or zirconium.

According to a preferred form of realization of a method according to the invention at least one target is used which consists of titanium or of titanium and aluminum or of zirconium.

For manufacturing nitrides, oxides, carbides, oxynitrides or carbonitrides which may provide different layer characteristics and color appearances to the layers manufactured according to the present invention, nitrogen gas or oxygen gas or a carbon-containing gas, e.g. $C_2H_2$ or $CH_4$ or a mixture of such gases, e.g. $N_2$ and $C_2H_2$, may be fed to the coating chamber for operating the HIPIMS-process. Preferably a coating according to the present invention is applied to substrates at which the hard-material layer shall have a decorative function.

Methods according to the invention and as described here are especially and very highly suited for coating different decorative objects as substrates which may be of different materials. A highly significant advantage of using a method according to the present invention for manufacturing decorative hard-material layers is that one may also coat temperature sensitive substrates which, as an example, may not be exposed to temperatures above 200° C. This becomes possible because the HIPIMS-processes according to the invention may be operated so that the duration of a power pulse, $t_{Puls}$, or the duration of the single pulses within a power pulse-sequence or the duration of a power pulse-sequence, $t_{Pussequenz}$, as well as the respective pulse pauses (Duty-Cycle) and the relevant target surface may be selected so that very low coating temperatures, i.e. very low substrate temperatures may be met during the coating process without occurrence of process instabilities.

According to the invention one may produce hard-material layers with different colors of the gold standard by setting of a respective nitrogen flow but also other hard-material layers may be produced, the color appearance thereof being adjustable within a large coating range by setting of the respectively applied reactive gas flow or of the concentration of different reactive gases.

In the frame of the present invention and as an example, decorative hard-material layers with predetermined color and with an excellent homogeneous appearance, with very high hard hardness and super-smooth surface were manufactured according to the invention. The reactive gas flows used as well as the measured mechanical characteristic of the manufactured hard-material layers are shown in table 1. All the processes were realized at substrate temperatures between 150° C. and 500° C.

TABLE 1

Reactive gas flows as used and mechanical characteristics of TiN-, TiCN-, and TiC- hard-material layers deposited according to the present invention for achieving different predetermined homogeneous colors for decorative applications

| Example | Ar [sccm] | N$_2$ [sccm] | C$_2$H$_2$ [sccm] | Hardness $_{HIT}$ [GPa] | E-Modul [GPa] |
|---------|-----------|--------------|-------------------|-------------------------|---------------|
| 1 | 210 | 50 | 0 | 33 | 420 |
| 2 | 210 | 50 | 6 | 32 | 440 |
| 3 | 210 | 50 | 14 | 37 | 400 |
| 4 | 210 | 30 | 20 | 36.3 | 450 |
| 5 | 210 | 40 | 20 | 44 | 462 |
| 6 | 210 | 20 | 24 | 38.3 | 426 |
| 7 | 150 | 30 | 30 | 42.4 | 465 |

The very high mechanical stability of those hard-material layers and respectively the very good combination of hardness and E-Module allow that these layers provide at the objects coated therewith a durable color appearance.

These layers have a very good adherence to the substrate and have a very high wear resistance. Consequently, these decorative hard-material layers may be used over years.

The methods according to the present invention allow to reach highly homogeneous color appearances even if the substrates have very extended surfaces to be coated.

Methods according to the present invention are especially suited whenever a multitude of substrates are to be distributed along the height extend of a large coating chamber and a homogeneous color appearance over all substrates shall be reached.

What is claimed is:

1. A method for coating at least parts of a surface of a substrate or for manufacturing substrates with a part of the surface provided with a decorative hard material layer in a coating chamber, whereby a reactive HIPIMS-process is applied for manufacturing a hard-material layer, which makes use of reactive gases, an inert gas and of at least one target comprising titanium which reacts during operating the reactive HIPIMS-process with the reactive gases in such a manner, that, thereby, a predetermined layer color is produced, wherein the reactive HIPIMS-process is operated by applying:

power pulse-sequences with an energy content of at least 0.2 Joule/cm$^2$ with respect to a surface of the at least one target wherein each power pulse-sequence comprises a burst of pulses with a first time between each pulse, and each power-pulse sequence is separated from each other by a second time, wherein the second time is greater than the first time, and adjusting power density per power pulse-sequence by adjusting a power of the burst of pulses of the power pulse-sequence, wherein the power of each pulse of the power pulse-sequence is held constant at a maximum value for a first predetermined period of time and is reduced to a reference value and held constant at the reference value for a second predetermined period of time before increasing to form another pulse, wherein the adjusting power density per power pulse-sequence includes adjusting a duration of at least two of the pulses of the power pulse-sequence, while maximum values of the at least two of the pulses are held substantially equal; and wherein for conducting the reactive HIPIMS-process applied for manufacturing the hard-material layer, the inert gas includes Ar, the reactive gases include N$_2$ and C$_2$H$_2$ and are used for producing TiCN-layers, wherein a flow rate of Ar is 150 to 210 sccm, a flow rate of N$_2$ is 20 to 50 seem and a flow rate of C$_2$H$_2$ is greater than 0 to less than or equal to 30 sccm, wherein the power pulse-sequences cause the coating to achieve a homogeneous color appearance.

2. The method of claim 1 wherein the energy content in the power pulse-sequences, with respect to the surface of the at least one target, is at least 1 Joule/cm$^2$ per power pulse-sequence.

3. The method of claim 1 wherein the power density is at least 100 W/cm$^2$.

4. The method of claim 3 wherein the power density is at least 500 W/cm$^2$.

5. The method of claim 4 wherein the power density is at least 1000 W/cm$^2$.

6. The method according to claim 1, wherein a temperature of the substrate is below 200° C. for coating temperature-sensitive substrates.

7. The method of claim 1, wherein a concentration of nitrogen in the coating chamber is controlled by regulating the flow rate of N2, so of a nitrogen gas flow and the nitrogen gas flow is regulated so, that the homogenous color appearance accords with a color according to Gold 2N18 or 1N14 or 3N18.

8. Hard-material layer, manufactured by making use of a method according claim 1, characterized by the fact, that the hard-material layer has a hardness of at least 30 GPa.

9. The method of claim 1, wherein a height of the coating chamber is 400 mm or more.

10. The method of claim 1, wherein the adjusting power density per power pulse-sequence causes an immediately subsequent cycle of a power pulse-sequence to have a different power density from an immediately preceding cycle of a power-pulse sequence, respectively.

11. The method of claim 1, wherein the reference value is zero.

12. A method for coating at least parts of a surface of a substrate or for manufacturing substrates with a part of the surface provided with a decorative hard-material layer in a coating chamber, whereby a reactive HIPIMS-process is applied for manufacturing a hard-material layer, which makes use of reactive gases, an inert gas and of at least one target comprising titanium which reacts during operating the reactive HIPIMS-process with the reactive gases in such a manner, that, thereby, a predetermined layer color is produced, wherein the reactive HIPIMS-process is operated by applying:

power pulse-sequences with an energy content of at least 0.2 Joule/cm$^2$ with respect to a surface of the at least one target wherein each power pulse-sequence comprises a burst of pulses with a first time between each pulse, and each power-pulse sequence is separated from each other by a second time, wherein the second time is greater than the first time, and adjusting power density per power pulse-sequence by adjusting a power of the burst of pulses of the power pulse-sequence, wherein the power of a first pulse of the power pulse-sequence is held constant at a first maximum value for a first predetermined period of time and is reduced to a reference value and held constant at the reference value for a second predetermined period of time before increasing to a second maximum value of a second pulse, wherein the adjusting power density per power pulse-sequence includes adjusting the second maximum value to be greater than the first maximum value, while a duration of the second maximum value is substantially equal to a duration of the first maximum value; and wherein for conducting the reactive HIPIMS-process applied for manufacturing the hard-material layer, the inert gas includes Ar, the reactive gases include $N_2$ and $C_2H_2$ and are used for producing TiCN-layers, wherein a flow rate of Ar is 150 to 210 sccm, a flow rate of $N_2$ is 20 to 50 seem and a flow rate of $C_2H_2$ is greater than 0 to less than or equal to 30 sccm, wherein the power pulse-sequences cause the coating to achieve a homogeneous color appearance.

13. The method of claim 12 wherein the energy content in the power pulse-sequences, with respect to the surface of the at least one target, is at least 1 Joule/cm$^2$ per power pulse-sequence.

14. The method of claim 12 wherein the power density is at least 100 W/cm$^2$.

15. The method of claim 14 wherein the power density is at least 500 W/cm$^2$.

16. The method of claim 15 wherein the power density is at least 1000 W/cm$^2$.

17. The method according to claim 12, wherein a temperature of the substrate is below 200° C. for coating temperature-sensitive substrates.

18. The method of claim 12, wherein a concentration of nitrogen in the coating chamber is controlled by regulating the flow rate of N2, so, that the homogenous color appearance accords with a color according to Gold 2N18 or 1N14 or 3N18.

19. Hard-material layer, manufactured by making use of a method according claim 12, characterized by the fact, that the hard-material layer has a hardness of at least 30 GPa.

20. The method of claim 12, wherein a height of the coating chamber is 400 mm or more.

21. The method of claim 12, wherein the adjusting power density per power pulse-sequence causes an immediately subsequent cycle of a power pulse-sequence to have a different power density from an immediately preceding cycle of a power-pulse sequence, respectively.

22. The method of claim 12, wherein the reference value is zero.

* * * * *